(12) United States Patent
Choi

(10) Patent No.: US 6,509,280 B2
(45) Date of Patent: Jan. 21, 2003

(54) METHOD FOR FORMING A DIELECTRIC LAYER OF A SEMICONDUCTOR DEVICE

(75) Inventor: Sung-Je Choi, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 10/076,233

(22) Filed: Feb. 13, 2002

(65) Prior Publication Data

US 2002/0115275 A1 Aug. 22, 2002

(30) Foreign Application Priority Data

Feb. 22, 2001 (KR) .............................................. 01-8857

(51) Int. Cl.⁷ ............................................ H01L 21/469
(52) U.S. Cl. ........................ 438/778; 438/239; 438/785
(58) Field of Search ................................ 438/239, 240, 438/393, 396, 778, 785, 786, 3, 255, 253

(56) References Cited

U.S. PATENT DOCUMENTS 5,923,056 A     7/1999  Lee et al.
6,335,240 B1 *  1/2002  Kim et al. .................. 438/253
2002/0094632 A1 * 7/2002  Agarwal et al. ............ 438/239
2002/0100418 A1 * 8/2002  Sandhu et al. .............. 118/719
2002/0108570 A1 * 8/2002  Lindfors ..................... 118/715

* cited by examiner

Primary Examiner—Tuan H. Nguyen
(74) Attorney, Agent, or Firm—Marger, Johnson & McCollom, P.C.

(57) ABSTRACT

A method for forming a dielectric layer of a semiconductor device is disclosed. A semiconductor wafer is loaded into a reaction chamber. A source gas mixture containing at least two mixed chemical reactants is introduced into the reaction chamber, thereby chemically adsorbing a portion of the source gas mixture onto a surface of the semiconductor wafer. The chamber is purged or pumped to remove physisorbed reactants therefrom. The source gas mixture chemically adsorbed on the surface of the semiconductor wafer is oxidized to form an atomic layer.

18 Claims, 8 Drawing Sheets

METHOD FOR FORMING A DIELECTRIC LAYER OF A SEMICONDUCTOR DEVICE

BACKGROUND OF THE INVENTION

1. Field of the Invention

The present invention relates to semiconductor manufacturing and, more particularly, to a method for forming a dielectric layer of a semiconductor device by atomic layer deposition (ALD) and a capacitor using the same.

2. Description of the Related Art

As semiconductor memory devices increase in memory cell density, there is a continuing challenge to maintain sufficiently high storage capacitance despite decreasing cell area. Thus, much effort is spent on obtaining a sufficient capacitance on a limited area of cell. There have been various attempts to achieve this goal. One such attempt is to employ a capacitor dielectric layer having a high-dielectric constant. As another example, hemispherical grain (HSG) polysilicon electrodes are introduced to increase an available area of the cell area.

In line with these efforts, a metal oxide film of aluminum or tantalum is used as a dielectric material, replacing conventional silicon oxide film or nitride film. However, such high dielectric constant materials have drawbacks such as poor leakage current characteristics.

U.S. Pat. No. 5,923,056 issued to Lee, Woo-Hyeoung, et al. discloses metal oxides for use in a semiconductor device. Here, aluminum oxide ($Al_2O_3$) is doped with dopants of Group IV materials, for example, Zr, Si, Ti, and the like at about 0.1 percent to about 30 percent by weight of aluminum oxide in order to improve the leakage current characteristics. In addition, a stacked layer of doped aluminum oxide and undoped aluminum oxide is disclosed. The doped aluminum oxide films are formed on the substrate using a reactive sputtering. An aluminum target with 1 percent by weight of silicon distributed uniformly in the target is used to form the silicon-doped films. An aluminum target with 0.5 weight percent of zirconium distributed uniformly in the target is used to form the zirconium-doped films.

Furthermore, the fabrication of a multi-layer structure by an atomic layer deposition (hereinafter, referred as ALD) process is also suggested. The conventional ALD provides a thin film by supplying reactants in pulses, separated from each other by a purge gas, i.e., alternatively pulsing a first precursor gas and a second precursor gas separated from the first precursor gas into the region of the substrate surface. Between precursor pulses the process region is exhausted and a pulse of purge gas is injected. The ALD process offers several advantages over a conventional CVD (chemical vapor deposition) process. According to the conventional ALD process, the composition of a thin film can be controlled more precisely, and contaminant particles can be reduced. Furthermore, the step coverage of layer in ALD process is better as compared with the step coverage of the conventional CVD layer.

To further describe the concept of ALD, FIG. 1 illustrates a gaseous reactant AXn (g) supplied to the surface of a wafer 10 to form a thin film thereon in a reaction chamber. The portion of the supplied reactant AXn (g) is chemically adsorbed ("chemisorption") onto the surface of the wafer 10 in a solid state. Another portion of the supplied reactant is also physically adsorbed ("physisorption") onto the chemisorbed reactant ("physisorption"). The chemisorption occurs most at the wafer surface while the physisorption occurs primarily on the chemisorbed reactant.

As shown in FIG. 2, when the physically adsorbed ("physisorbed") reactant AXn(g) is removed by purging, the chemically adsorbed ("chemisorbed") AXn(s) in a solid state remains on the surface of the wafer 10. Herein, Xn indicates a chemical ligand including n radicals.

As shown in FIG. 3, when vaporized $H_2O$ is introduced to the surface of the chemisorbed AXn(s), A is oxidized to produce AO on the wafer surface and Xn radical is reacted with H radical to give HXn (g), which can be removed from the wafer surface by purging.

As shown in FIG. 4, the residual impurities such as chemical ligands are removed from the wafer surface by purging. Thus, the oxide film, which consists of an atomic layer of AO(s) in a solid state, is formed.

Referring to FIG. 5, another reactant BYn (g) is introduced or injected into the reaction chamber in the same method as described above. The reactant BYn (g) is chemisorbed onto the surface of the oxide of AO(s). Then, an oxide film including BO(s) is formed on the oxide film of AO(s) in the form of an atomic layer through purging, oxidizing and purging processes.

Accordingly, two types of the oxide films are formed on the wafer surface alternately and repeatedly, thereby forming a dielectric layer comprising plural atomic layers as shown in FIG. 5.

In the conventional ALD method, however, as gaseous reactants A and B are separately introduced into the reaction chamber to form an atomic layer, an overall thin film deposition process is very complicated. In addition, by-products are generated due to the chemical reaction of the reaction gases A and B, and the concentration of the impurity in the oxide film increases.

Accordingly, a need arises for an improved ALD method for forming an atomic layer without such problems.

SUMMARY OF THE INVENTION

The present invention contemplates a method for forming a dielectric layer by ALD. According to one embodiment of the present invention, a semiconductor wafer is loaded into a reaction chamber. A source gas mixture containing at least two mixed chemical reactants, e.g., first and second metal compound gases, is introduced into the reaction chamber, thereby chemically adsorbing a portion of the source gas mixture onto a surface of the wafer. The chamber is purged or pumped to remove physisorbed reactants therefrom. The source gas mixture chemically adsorbed on the surface of the wafer is oxidized to form an atomic layer thereon.

According to another embodiment of the present invention, the first metal compound gas is aluminum compound gas, such as TMA (Tri Methyl Aluminum) or TEA (Tri Ethyl Aluminum), and the second metal compound gas is titanium compound gas, such as TiCl4, TDMAT (Tetra Dimethylamino Titanium) or TDEAT (Tetra diethylamino Titanium). The oxidation gas used in the present invention comprises one selected from the group consisting of $H_2O$, $O_3$, $O_2$ plasma, $N_2O$ and mixtures thereof.

A dielectric layer according to another embodiment of the present invention is formed as a multi-layer structure of atomic layers by forming the first atomic layer and the second atomic layer on the surface of the wafer repeatedly and alternately. The dielectric constant of the dielectric layer comprising a multi-layer structure of atomic layers can be adjusted by varying a ratio of the first metal compound gas to the second metal compound gas.

BRIEF DESCRIPTION OF THE DRAWINGS

The above and other objects and advantages of the present invention will become readily apparent by reference to the following detailed description when considered in conjunction with the accompanying drawings wherein.

DESCRIPTION OF THE PREFERRED EMBODIMENT

Hereinafter, the preferred embodiments of the present invention will be described in detail with reference to the accompanying drawings. In the following description, well known semiconductor processing equipment and methodology have not been described in detail in order to not unnecessarily obscure the present invention.

Figure 1:
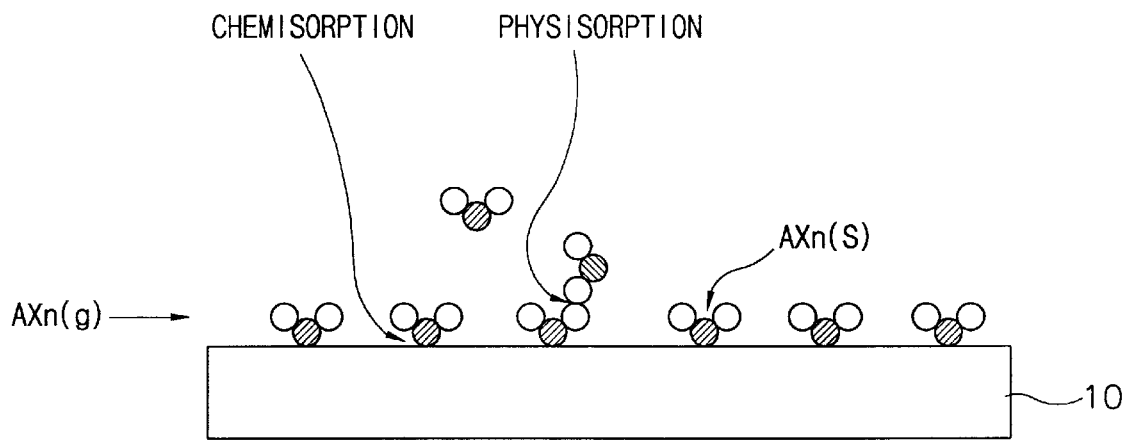
FIGS. 1 to 5 are views illustrating processing steps for forming a multi-layer structure of atomic layers by a conventional ALD (Atomic Layer Deposition) process.
Figure 2:
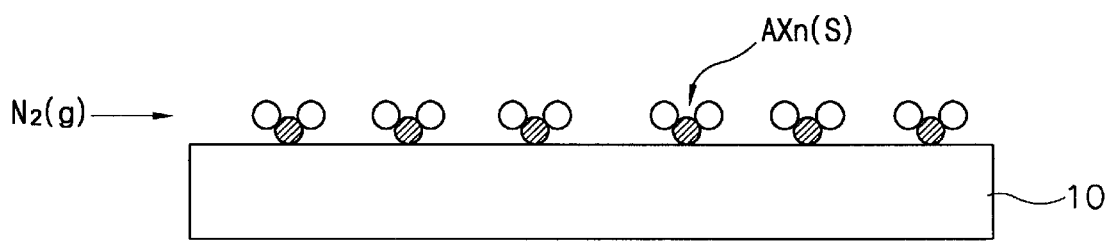
Figure 3:
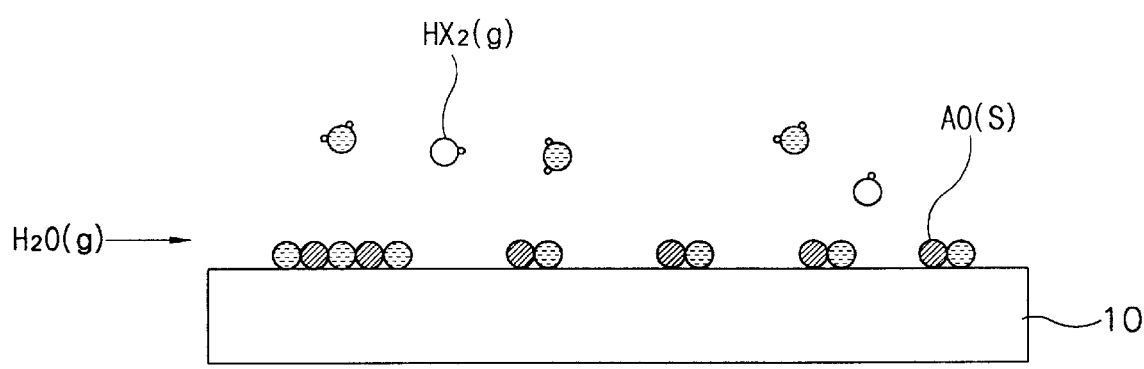
Figure 4:
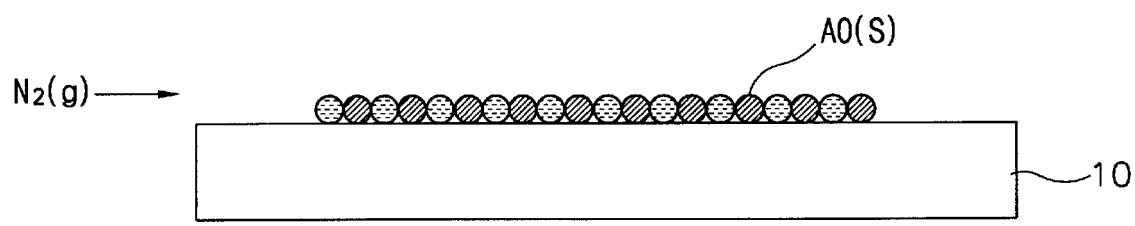
Figure 5:
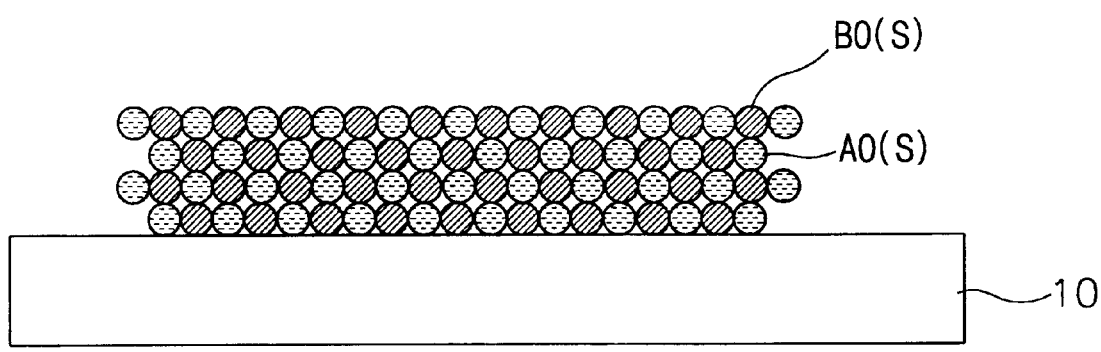
Figure 6:
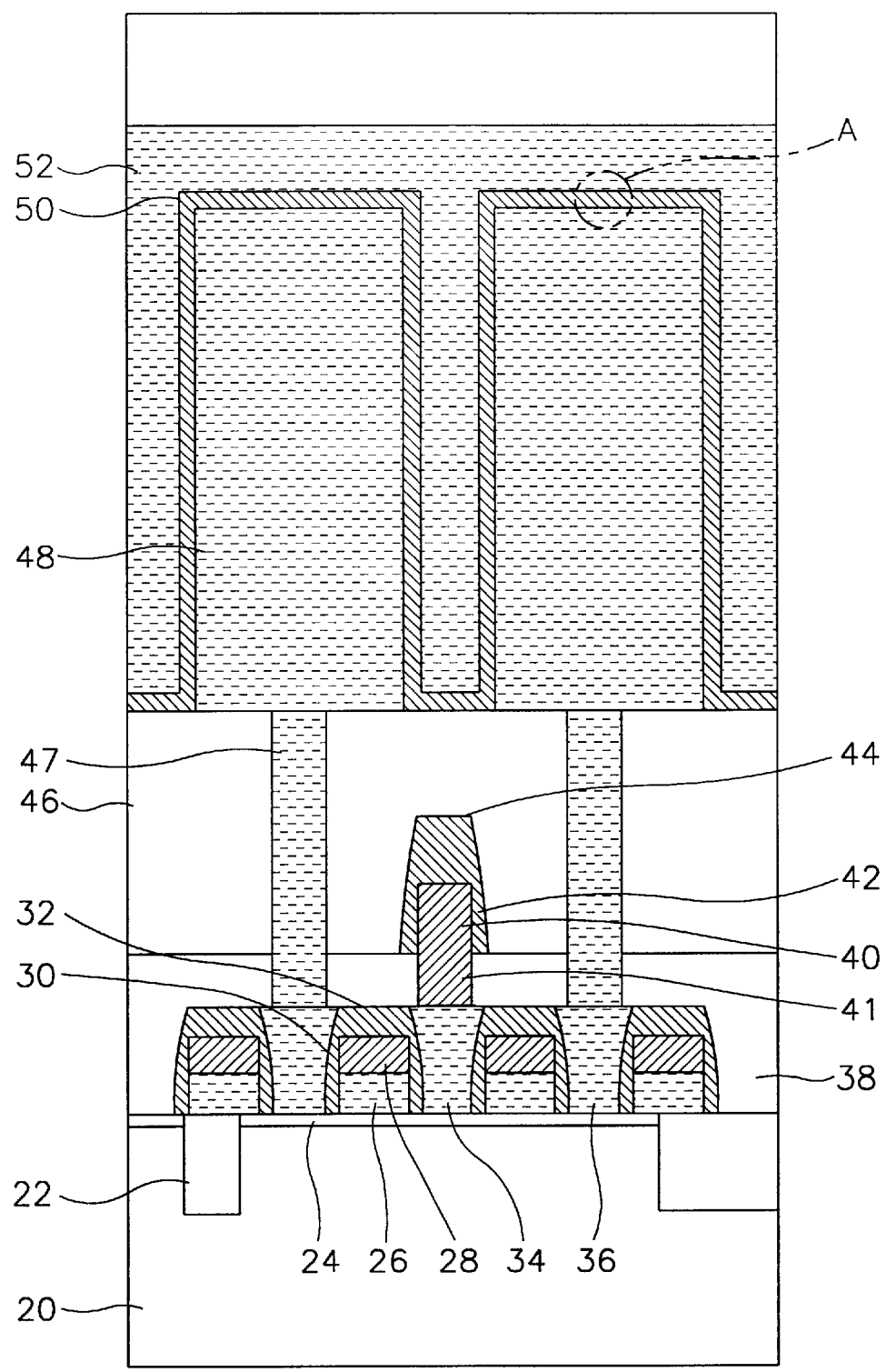
FIG. 6 is a sectional view of DRAM device in which dielectric layer is formed, according to an embodiment of the present invention.

FIG. 6 illustrates one embodiment of the present invention where a dielectric layer of a semiconductor device is used to construct a capacitor of DRAM cells using known techniques. For example, device isolation layers 22 are formed in a silicon substrate 20 and an active element is formed in the active region defined by the device isolation layers 22. Typically, the active element is an MOS transistor.

The MOS transistor includes a gate electrode, e.g., a polycide layer including a polysilicon layer 26 and tungsten silicide layer 28 formed over a gate dielectric layer 24. The gate electrode is protected by a first sidewall spacer 30 and a mask layer 32 that are made of an insulation material. Using the gate electrode as a mask, impurities are ion-implanted into the active region of the silicon substrate to form source and drain regions.

A self-aligned contact technique can be used to form contacts for the drain region and the source region and a conductive material such as doped-polysilicon is used to form contact pads 34 and 36. The contact pads 34 and 36 can be electrically separated from each other using a chemical and mechanical polishing process (hereinafter, referred to as CMP process). A first interlayer dielectric film 38 is formed over the MOS transistor as constructed above is planarized using conventional techniques such as the CMP process.

Bit line contact plugs 41 overlying the contact pad 34 are formed within the first interlayer dielectric film 38. Then, a bit line 40 is formed over the bit line contact plug 41 and is electrically connected thereto. The bit line 40 can be protected by a second sidewall spacer 42 and a mask layer 44.

A second interlayer dielectric film 46 is formed on the first interlayer dielectric film 38 on which the bit line 40 is formed. The second interlayer dielectric film is also planarized using the conventional techniques such as CMP. A capacitor is formed on the second interlayer dielectric film 46. A buried contact 47 is formed within the second interlayer dielectric film 46 and contacts the contact pad 36 electrically connected to the source region.

A lower electrode layer 48 formed of a conductive material such as doped polysilicon is formed on the second interlayer dielectric film 46 overlying the source contact plug. To increase a surface area of the lower electrode layer 48, the lower electrode layer 48 may be formed to have a height of about 5,000~15,000 Å in a cylindrical shape and a rugged surface using hemispherical grain (HSG) silicon.

A capacitor dielectric layer 50 is formed on the surface of the lower electrode layer 48. Next, an upper electrode 52 comprising a conductive material such as doped-polysilicon is formed on the capacitor dielectric layer 50.

Figure 7:
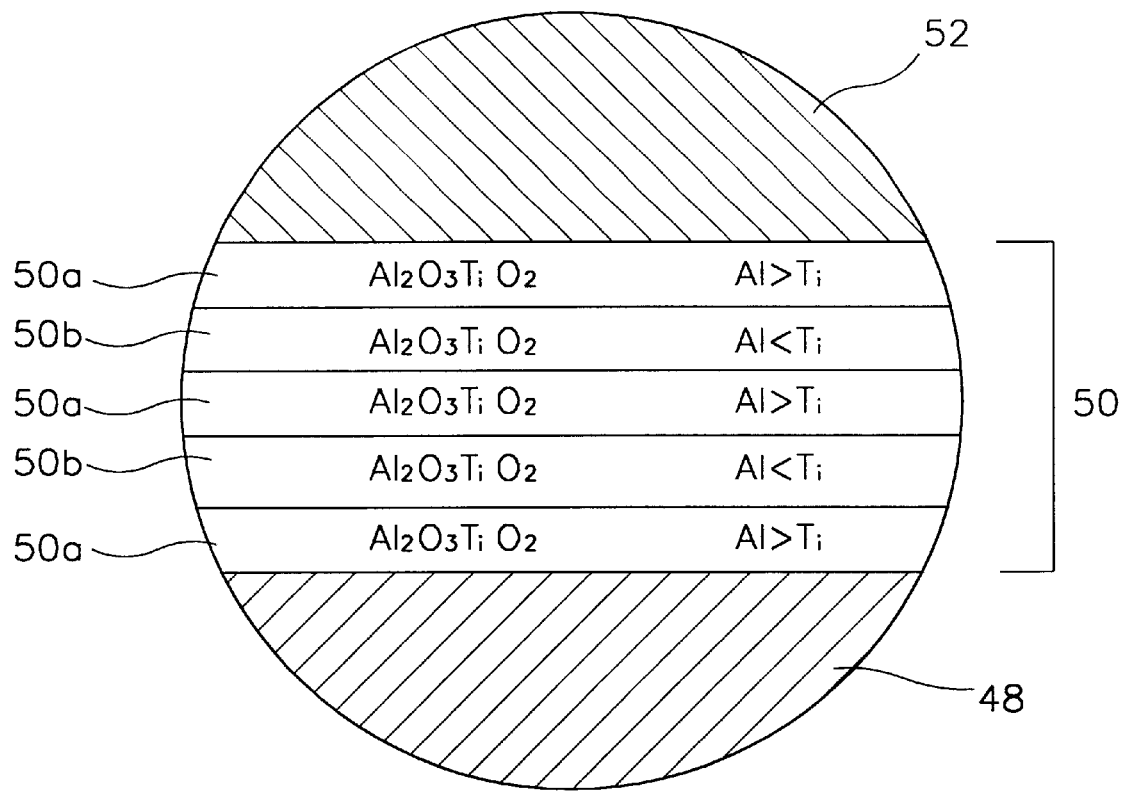
FIG. 7 is a partially enlarged sectional view of DRAM device, as indicated by a circle A in FIG. 6.

FIG. 7 is a partially enlarged sectional view of a DRAM device, as indicated by a circle A in FIG. 6. As shown in FIG. 7, the dielectric layer 50 according to an embodiment of the present invention is formed by forming a first mixed atomic layer 50a and a second mixed atomic layer 50b, repeatedly and alternately.

The first mixed atomic layer 50a has a high dielectric constant characteristic because the composition ratio of an aluminum oxide is a greater than that of the titanium oxide in the layer 50 and thus the second mixed atomic layer 50b has an excellent leakage current characteristic. Accordingly, the dielectric layer 50 in accordance with an embodiment of the present invention, as a whole, has both high dielectric constant and improved leakage current characteristics.

Figure 8:
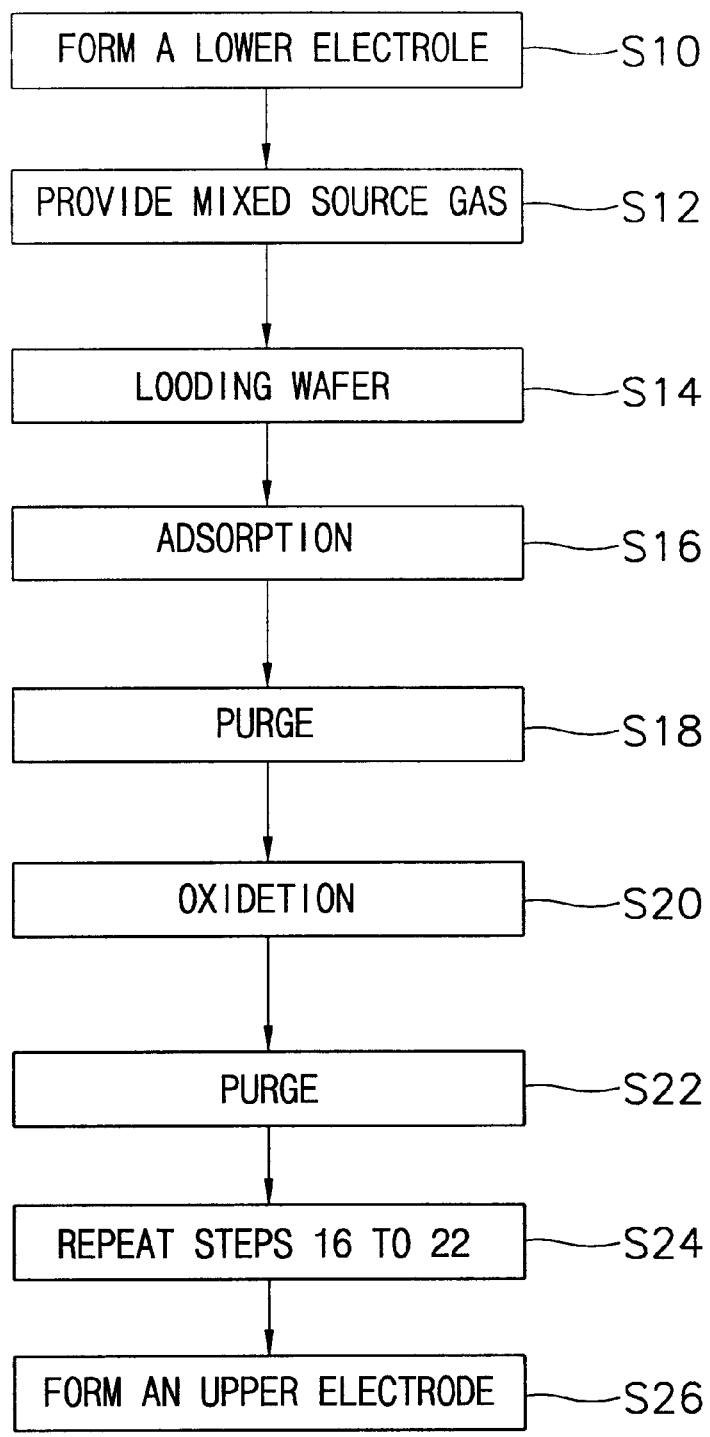
FIG. 8 is a flowchart showing processing steps for forming capacitors employing a dielectric layer according to an embodiment of the present invention.

FIG. 8 illustrates a method for forming a capacitor on semiconductor device according to one embodiment of the present invention. As described above, a semiconductor wafer such as a silicon wafer is provided with a lower electrode layer (step S10).

To provide source gas mixtures in accordance with one embodiment of the present invention, a first chemical reactant, i.e., a metal compound gas $Al(CH_3)_3$, which gives a first metal oxide $Al_2O_3$ having a high dielectric constant, is mixed with a second chemical reactant, i.e., a metal compound gas $TiCl_4$, which gives a second metal oxide $TiO_2$ having an excellent leakage current characteristic. This is illustrated as follows.

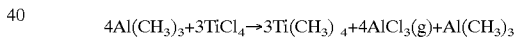

$4Al(CH_3)_3 + 3TiCl_4 \rightarrow 3Ti(CH_3)_4 + 4AlCl_3(g) + Al(CH_3)_3$

In the above reaction equation, 3TiCl4 functions as a titanium source and $Al(CH_3)_3$ works as an aluminum source. Herein, the ratio of the titanium source to the aluminum source is adjusted to provide a first source gas mixture with the amount of the aluminum source greater than that of the titanium source and a second source gas mixture with the amount of the titanium source greater than that of the aluminum source (step S12).

As described above, the $AlCl_3$ may be filtered because the AlCl3 is present as a gas or powder type depending on the process temperature. Accordingly, as the byproduct, generated during the reaction of source gases, can be removed in advance, unwanted contaminant particles during processing steps can be reduced.

The silicon wafer, provided at the step 10, is loaded in the reaction chamber for an atomic layer deposition (step S14).

The first source gas mixture that is produced at the step 12 is introduced into the reaction chamber in order that the source gas mixture containing mixed chemical reactants, for instance $3Ti(CH_3)_4 + Al(CH_3)_3$, is chemically adsorbed onto the surface of the silicon wafer (step S16).

After the reactants, i.e., the first source gas mixture, are chemisorbed onto the surface of the silicon wafer, an inert purging gas such as an $N_2$ gas is introduced into the ALD reaction chamber to purge the surface of the silicon wafer, resulting in removing physisorbed reactants from the silicon wafer and only maintaining a chemisorbed on the silicon wafer (step S18). Also, vacuum can be used to pump the chamber to remove physisorbed reactants.

When oxidation gases such as $H_2O$, $O_3$, plasma $O_2$, $N_2O$, and the like is introduced into the ALD reaction chamber so as to oxidize the surface of the silicon wafer, a composite oxide film is formed under the following reaction on the surface of the silicon wafer, as shown in FIG. 7 (step S20).

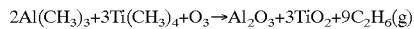
$$2Al(CH_3)_3 + 3Ti(CH_3)_4 + O_3 \rightarrow Al_2O_3 + 3TiO_2 + 9C_2H_6(g)$$

Therefore, in such oxidation reactions, only a C2H6 type material is generated as the by-products. Accordingly, the contaminants in the oxidation film may be minimized.

After oxidizing the surface of the silicon wafer, the surface of the silicon wafer is purged with inert gases such as an $N_2$ gas. Consequently, the first atomic layer consisting of atomic layers is formed on the surface of the silicon wafer (step S22).

In an embodiment of the present invention, that is, each of the source substances (reactants), is oxidized during the same processing step. As a result, the process of forming the dielectric layer can be simplified.

Subsequently, the second and first source gas mixtures are alternately provided in the reaction chamber to alternately form the first and second atomic layers (step S24). However, a person skilled in the art will appreciate that other variations on the order of the first and second atomic layers can be formed.

Figure 9:
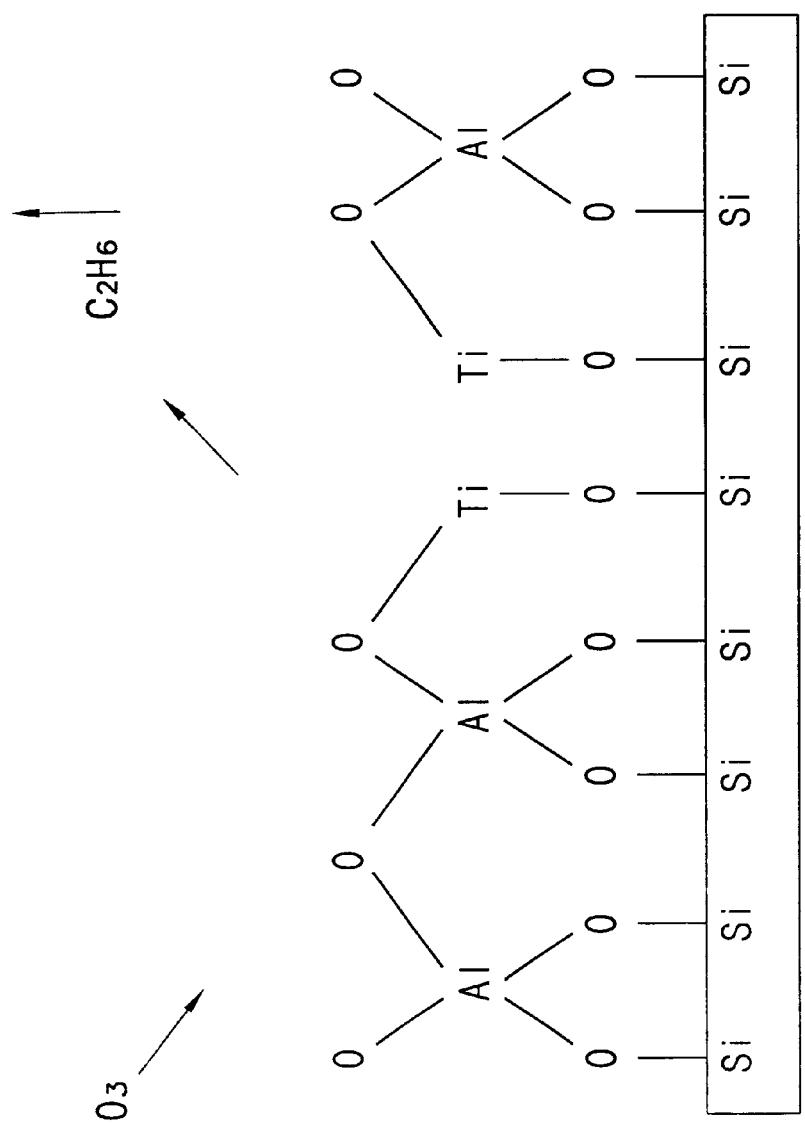
FIG. 9 is a view showing a construction of a composite oxide film having an atomic layer according to another embodiment of the present invention.
Figure 10:
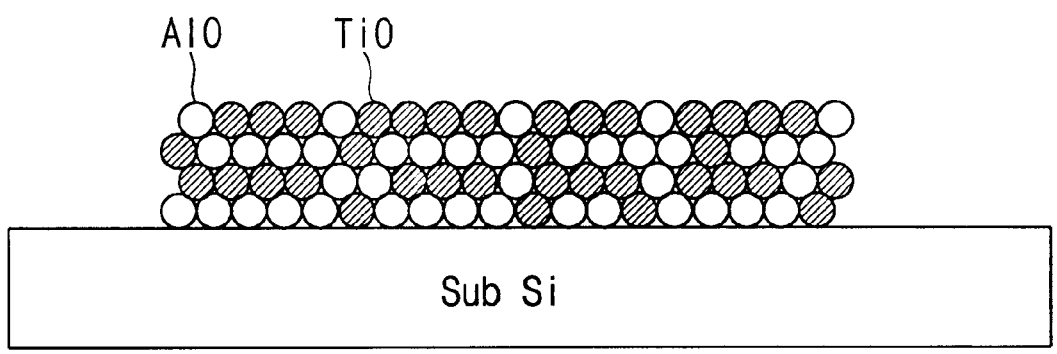
FIG. 10 is a view showing a multi-layer structure of atomic layers according to yet another embodiment of the present invention.

Finally, plural atomic layers shown in FIG. 9, as a dielectric layer of an embodiment of the present invention, is formed on the silicon wafer by repeating the processes at the step 24 and then the upper electrode layer (not shown) is formed on the dielectric layer (step S26). In an embodiment of the present invention, as described above, since the metal oxide having a high dielectric constant is combined with the metal oxide having an excellent leakage current characteristic in the atomic layer, the resulting dielectric layer has both an high dielectric constant and an excellent leakage current characteristic.

Because the reaction byproduct can be removed from the reaction chamber in advance before the source gas mixture is introduced in the chamber to form the atomic layers, the contamination caused by the byproduct in the reaction chamber can be minimized during the atomic layer deposition. This can lead to improved reliability of the semiconductor device.

According to an embodiment of the present invention, furthermore, at least two source materials can be oxidized in the same processing step because the source gas mixture containing mixed or un-separated reactants is used. Accordingly, the number of the process steps is reduced in comparison with the process of oxidizing different source gases separately, thereby increasing the productivity of the semiconductor fabrication.

Although the preferred embodiments of the present invention have been described, it is understood that the present invention should not be limited to these preferred embodiments but various changes and modifications can be made by one skilled in the art within the spirit and scope of the present invention as hereinafter claimed.

What is claimed is:

1. A method for forming a dielectric layer of a semiconductor device, comprising:
   a) loading a semiconductor wafer into a reaction chamber;
   b) introducing a source gas mixture containing at least two mixed chemical reactants into the reaction chamber, thereby chemically adsorbing a portion of the source gas mixture onto a surface of the silicon wafer;
   c) purging or pumping the chamber; and
   d) oxidizing the source gas mixture chemically adsorbed on the surface of the semiconductor wafer.

2. The method for forming a dielectric layer of a semiconductor device as claimed in claim 1, further comprising:
   f) purging or pumping the chamber; and
   g) forming a multi-layer structure of atomic layers by repeatedly carrying out the steps of b) through d).

3. A method for forming a dielectric layer of a semiconductor device as claimed in claim 2, wherein the dielectric constant of the multi-layer structure is adjusted by controlling a ratio of the first compound gas to the second metal compound gas.

4. A method for forming a dielectric layer of a semiconductor device as claimed in claim 3, wherein the content of the first metal compound gas is less than that of the second metal compound gas.

5. A method for forming a dielectric layer of a semiconductor device as claimed in claim 3, wherein the content of the first metal compound gas is greater than that of the second metal compound gas.

6. The method for forming a dielectric layer of a semiconductor device as claimed in claim 1, wherein the source gas mixture is formed by mixing a first metal compound gas with a second metal compound gas, the first metal compound gas forming a first metal oxide to have a high dielectric constant and the second metal compound gas forming a second metal oxide to have an excellent leakage current characteristic.

7. A method for forming a dielectric layer of a semiconductor device as claimed in claim 1, wherein the first metal compound gas is an aluminum compound gas and the second metal compound gas is a titanium compound gas.

8. A method for forming a dielectric layer of a semiconductor device as claimed in claim 7, wherein the aluminum compound gas is TMA (Trimethyl Aluminum) or TEA (Triethyl Aluminum).

9. A method for forming a dielectric layer of a semiconductor device as claimed in claim 7, wherein the titanium compound gas is $TiCl_4$, TDMAT (Tetra Dimethylamino Titanium) or TDEAT (Tetra Diethylamino Titanium).

10. A method for forming a dielectric layer of a semiconductor device as claimed in claim 1, wherein the oxidizing comprising using an oxidation gas comprising one selected from the group consisting of $H_2O$, $O_3$, $O_2$ plasma, $N_2O$ and mixtures thereof.

11. A method for forming a dielectric layer of a semiconductor device as claimed in claim 1, the method further comprising: filtering by-product produced during forming the source gas mixture.

12. A method for forming a dielectric layer of a semiconductor device comprising:
   a) providing a first source gas mixture in which a first metal compound gas is mixed with a second metal compound gas less than the first metal compound gas and a second source gas mixture in which the first metal compound gas is mixed with the second metal compound gas more than the first metal compound gas;
   b) loading a semiconductor wafer into a reaction chamber;
   c) introducing one of the first and second source gas mixtures into the reaction chamber, thereby chemically adsorbing a portion of the one of the first and second source gas mixtures onto a surface of the semiconductor wafer;

d) purging or pumping the chamber;

e) oxidizing the one of the first and second source gas mixtures chemically adsorbed on the surface of the semiconductor wafer to form a first atomic layer;

f) purging or pumping the chamber;

g) introducing the other one of first and second source gas mixtures into the reaction chamber, thereby chemically adsorbing a portion of the other one of the first and second source gas mixtures onto the first atomic layer;

f) purging or pumping the chamber;

g) oxidizing the other one of the first and second gas mixtures chemically adsorbed on the surface of the first atomic layer to form a second atomic layer; and h) purging or pumping the chamber.

13. A method for forming a dielectric layer of a semiconductor device as claimed in claim 12, further comprising:

i) forming a multi-layer structure of the first and second atomic layers by repeatedly carrying out the steps of c) through h).

14. A method for forming a dielectric layer of a semiconductor device as claimed in claim 12, wherein the first metal compound gas is an aluminum compound gas and the second metal compound gas is a titanium compound gas.

15. A method for forming a dielectric layer of a semiconductor device as claimed in claim 14, wherein the aluminum compound gas is TMA (Tri Methyl Aluminum) or TEA (Tri Ethyl Aluminum).

16. A method for forming dielectric layers on a semiconductor device as claimed in claim 14, wherein the titanium compound gas is $TiCl_4$, TDMAT (Tetra Dimethylamino Titanium) or TDEAT (Tetra Diethylamino Titanium).

17. A method for forming a dielectric layer of a semiconductor device as claimed in claim 12, wherein the oxidizing comprising using an oxidation gas comprises one selected from the group consisting of $H_2O$, $O_3$, $O_2$ plasma, $N_2O$ and mixtures thereof.

18. A method for forming a dielectric layer of a semiconductor device as claimed in claim 12, the method further comprising filtering by-products produced during providing the first and second source gas mixtures.

* * * * *

UNITED STATES PATENT AND TRADEMARK OFFICE
CERTIFICATE OF CORRECTION

PATENT NO.     : 6,509,280 B2
DATED          : January 21, 2003
INVENTOR(S)    : Choi It is certified that error appears in the above-identified patent and that said Letters Patent is hereby corrected as shown below:

<u>Title page,</u>
Item [54], Title, "SEMICONDUCTOR DEVICE" should read
-- SEMICONDUCTOR DEVICE AND A CAPACITOR USING THE SAME --.

Signed and Sealed this

Second Day of March, 2004

JON W. DUDAS
*Acting Director of the United States Patent and Trademark Office*